(12) United States Patent
Jeong et al.

(10) Patent No.: US 8,350,464 B1
(45) Date of Patent: Jan. 8, 2013

(54) ORGANIC LIGHT-EMITTING DISPLAY DEVICE

(75) Inventors: Hee-Seong Jeong, Yongin (KR); Soon-Ryong Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/269,445

(22) Filed: Oct. 7, 2011

(51) Int. Cl.
*H01L 51/00* (2006.01)
(52) U.S. Cl. ........................................ 313/503; 313/512
(58) Field of Classification Search ........... 313/498–512
See application file for complete search history.

(56) References Cited

U.S. PATENT DOCUMENTS

| | | | | |
|---|---|---|---|---|
| 2005/0269947 | A1* | 12/2005 | Kobayashi | 313/504 |
| 2008/0143649 | A1 | 6/2008 | Asaki et al. | |
| 2009/0179560 | A1* | 7/2009 | Chun et al. | 313/504 |
| 2010/0052524 | A1* | 3/2010 | Kinoshita | 313/504 |

FOREIGN PATENT DOCUMENTS

| | | |
|---|---|---|
| JP | 2010-062067 A | 3/2010 |
| JP | 2010-238677 A | 10/2010 |
| KR | 10 2009 0092731 A | 9/2009 |

* cited by examiner

*Primary Examiner* — Anne Hines
(74) *Attorney, Agent, or Firm* — Christie, Parker & Hale, LLP

(57) ABSTRACT

An organic light-emitting display device having improved extraction efficiency and viewing angle characteristics includes a sub-pixel having a resonating region in which light generated by an emission layer resonates and is emitted, and a non-resonating region in which light does not resonate and is emitted.

11 Claims, 5 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2011-0064085, filed on Jun. 29, 2011, in the Korean Intellectual Property Office, the disclosure of which is incorporated herein in its entirety by reference.

BACKGROUND

1. Field

Embodiments of the present invention relate to an organic light-emitting display device, and more particularly, to an organic light-emitting display device that has improved extraction efficiency and viewing angle characteristics.

2. Description of Related Art

In general, an organic light-emitting display device realizes colors by recombining holes and electrons, which are injected from an anode and a cathode to an emission layer, and has a structure in which the emission layer is interposed between a pixel electrode serving as the anode and an opposite electrode serving as the cathode.

A unit pixel of an organic light-emitting display device includes three sub-pixels: red, green, and blue sub-pixels. A desired color is realized by appropriately combining the three sub-pixels. That is, for each respective sub-pixel, an emission layer that emits one of the red, green, or blue colors is interposed between two electrodes, and a color of a unit pixel is realized by appropriately combining three respective color light beams.

Recently, a resonating structure in each sub-pixel has been developed, in order to improve the extraction efficiency of an organic light-emitting display device. That is, the resonating structure is configured so that a semi-transmissive electrode is formed at a side of one of the anode or the cathode, towards which an image is realized, and a total reflective electrode is formed at a side of the other one of the anode or the cathode. Thus, light beams constructively interfere with each other while reciprocating between the anode and the cathode, and light that is significantly enhanced may be extracted from each sub-pixel.

However, if a resonating structure is used in an organic light-emitting display device, the extraction efficiency of the organic light-emitting display device is improved, but the viewing angle characteristics of the organic light-emitting display device are degraded. That is, if a resonating structure is used in an organic light-emitting display device, luminance of the organic light-emitting display device may be reduced and/or color shift may become a concern depending on a viewer's viewing angle.

SUMMARY OF THE INVENTION

Embodiments of the present invention provide an organic light-emitting display device that has improved extraction efficiency and viewing angle characteristics.

Embodiments of the present invention provide a display that maintains excellent viewing angle characteristics as well as excellent extraction efficiency, in order to obtain an organic light-emitting display device with improved reliability.

According to an aspect of an embodiment of the present invention, there is provided an organic light-emitting display device including a sub-pixel including a first electrode and a second electrode facing one another; and an emission layer between the first electrode and the second electrode, wherein the sub-pixel has a resonating region in which light generated by the emission layer resonates and is emitted, and a non-resonating region in which light generated by the emission layer does not resonate and is emitted.

An image may be emitted towards the first electrode of the sub-pixel, a semi-transparent layer may be included in the first electrode in the resonating region, while the first electrode may not include a semi-transparent layer in the non-resonating region.

The first electrode may include a first transparent layer shared by the non-resonating region and the resonating region.

The organic light-emitting display device may further include a second transparent layer on the semi-transparent layer of the resonating region on a side opposite the first transparent layer.

The first transparent layer may include at least one of indium tin oxide (ITO) or indium zinc oxide (IZO).

The semi-transparent layer may include at least one of a metal material or a material for forming a Distributed Bragg Reflector.

The metal material may include at least one of silver (Ag), aluminum (Al), magnesium (Mg), copper (Cu), MgAg, or CaAg.

The material for forming the Distributed Bragg Reflector may include at least one of $SiO_2$, SiNx, ITO, $ZnO_2$, or $ZrO_2$.

An image may not be emitted towards the second electrode, and the second electrode may include a reflective layer.

An image may be emitted towards the second electrode, and the second electrode may include a semi-transparent layer.

Sizes of the resonating region and the non-resonating region of the sub-pixel may be substantially the same.

Sizes of the resonating region and the non-resonating region of the sub-pixel may be different from one another.

The above-described organic light-emitting display device may include both resonating and non-resonating structures, to improve extraction efficiency and viewing angle characteristics, thereby obtaining improved reliability.

BRIEF DESCRIPTION OF THE DRAWINGS

The above and other features and advantages of the present invention will become more apparent by describing in detail exemplary embodiments thereof, with reference to the attached drawings, in which.

DETAILED DESCRIPTION

Hereinafter, the present invention is described in detail by explaining exemplary embodiments thereof with reference to the attached drawings.

Figure 1:
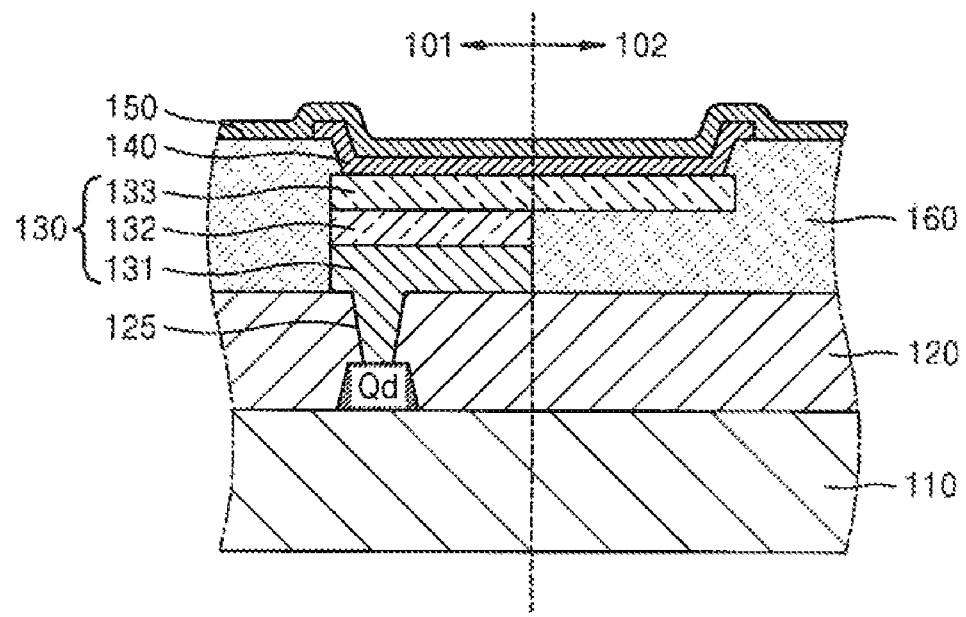
FIG. 1 is a cross-sectional view of a sub-pixel included in a unit pixel of an organic light-emitting display device according to an embodiment of the present invention.
Figure 2:
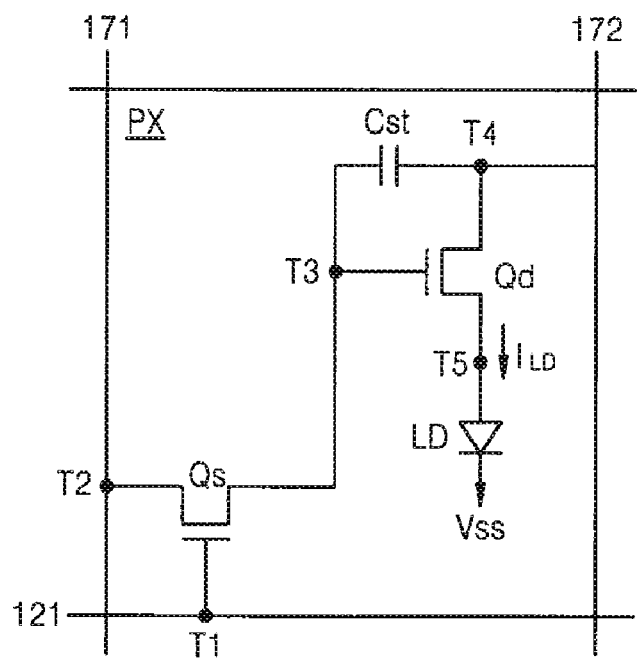
FIG. 2 is an equivalent circuit diagram of the sub-pixel of FIG. 1.

FIG. 1 is a cross-sectional view of a sub-pixel included in a unit pixel of an organic light-emitting display device according to an embodiment of the present invention. FIG. 2 is an equivalent circuit diagram of the sub-pixel of FIG. 1. A unit pixel includes three color sub-pixels, namely, a red (R) sub-pixel, a green (G) sub-pixel, and a blue (B) sub-pixel. FIG. 1 shows one of the three-color sub-pixels. The other sub-pixels have the same or similar structures as that of FIG. 1. In addition, unit pixels each including three-sub-pixels are repeatedly arranged in column and row directions in an organic light-emitting display device.

Referring to FIG. 2, signal lines, namely, a scanning signal line 121, a data line 171, and a driving voltage line 172 are connected to a sub-pixel PX.

The scanning signal line 121 transfers a gate signal (or a scanning signal), a data line 171 transfers a data signal, and a driving voltage line 172 transfers a driving voltage.

The sub-pixel PX includes a switching transistor Qs, a driving transistor Qd, a storage capacitor Cst, and an organic light-emitting diode LD.

The switching transistor Qs includes a control terminal T1, an input terminal T2, and an output terminal T3. The control terminal T1, the input terminal T2, and the output terminal T3 are connected to the scanning signal line 121, the data line 171, and the driving transistor Qd, respectively. The switching transistor Qs transmits a data signal received from the data line 171 in response to a scanning signal received from the scanning signal line 121.

The driving transistor Qd includes a control terminal T3, an input terminal T4, and an output terminal T5. The control terminal T3, the input terminal T4, and the output terminal T5 are connected to the switching transistor Qs, a driving voltage line 172, and the organic light-emitting diode LD, respectively. The output terminal T3 of the switching transistor Qs is connected to the control terminal T3 of the driving transistor Qd. An output current $I_{LD}$ may flow, wherein an amount of the output current $I_{LD}$ varies according to a voltage between the control terminal T3 and the output terminal T5.

The storage capacitor Cst is connected between the control terminal T3 and the input terminal T4 of the driving transistor Qd. The storage capacitor Cst stores a data signal applied to the control terminal T3 of the driving transistor Qd, and maintains the data signal even after the switching transistor Qs is turned off.

The organic light-emitting diode LD includes a pixel electrode (hereinafter, referred to as a first electrode) connected to the output terminal T5 of the driving transistor Qd, an opposite electrode (hereinafter, referred to as a second electrode) connected to a common voltage Vss, and an emission layer interposed between the first electrode and the second electrode, wherein the emission layer emits light according to a voltage applied between the first electrode and the second electrode.

A structure of the sub-pixel of the organic light-emitting diode LD is described in detail with reference to FIG. 1.

Referring to FIG. 1, the driving transistor Qd is formed on an insulating substrate 110, and may include a transparent glass or a transparent plastic material. Although not illustrated in FIG. 1, the switching transistor Qs, and the signal lines, namely, the scanning signal line 121, the data line 171, and the driving voltage line 172, are also formed on the insulating substrate 110.

A protective layer 120 formed of an organic material or an inorganic material is formed on the driving transistor Qd. A first electrode 130 that is connected to the driving transistor Qd through a contact hole 125 is formed on the protective layer 120.

An emission layer 140 and a second electrode 150 may be sequentially formed on the first electrode 130. A sealing layer (not shown) for preventing or reducing penetration of moisture and oxygen may be formed on the second electrode 150. A reference numeral 160 denotes a pixel-defining layer.

In one embodiment, the first electrode 130 includes a structure in which the sub-pixel is divided into a resonating region 101 and a non-resonating region 102. That is, in FIG. 1, a right region of the sub-pixel may be a non-resonating region 102 in which the first electrode 130 includes a single first transparent layer 133 only, whereas a left region of the sub-pixel may be a resonating region 101 in which a semi-transparent layer 132 and a second transparent layer 131 are also included in the first electrode 130.

Thus, light generated by the emission layer 140 may be emitted outwards according to different mechanisms in the resonating region 101 and the non-resonating region 102, respectively.

That is, since the non-resonating region 102 is a region that does not cause resonance, light generated by the emission layer 140 is emitted outwards through the portion of the first electrode 130 having the first transparent layer 133 only.

However, since the resonating region 101 also includes the semi-transparent layer 132, light beams generated by the emission layer 140 form a micro cavity while reciprocating between the first electrode 130 including the semi-transparent layer 132 and the second electrode 150 that may be a total reflective electrode. In this case, the light beams constructively interfere with each other so that an optical intensity is reinforced. Since an appropriate condition for an interval between the first and second electrodes 130 and 150 for constructive interference may vary for each respective color R, G, or B, the interval between the first and second electrodes 130 and 150 may be appropriately determined according to the appropriate conditions. That is, the appropriate conditions for an interval between the first and second electrodes 130 and 150 for constructive interference may be proportional to a wavelength of light. Thus, enhanced light may be obtained by appropriately setting the interval between the first and second electrodes 130 and 150. In addition, light that is enhanced through the microcavity is emitted outwards through the first electrode 130.

As a result, non-resonating light that is emitted directly from the non-resonating region 102 in the sub-pixel and resonating light that is enhanced through the resonating region 101 are mixed with each other, thereby improving extraction efficiency and viewing angle characteristics.

That is, since light emitted from the resonating region 101 is enhanced by resonance, an intensity of the light and the straight or alignment characteristics of the light may be improved. Thus, since the extraction efficiency of the light is increased, and the straight characteristics of the light are increased, the luminance and/or color coordination are improved, even when a viewing angle is slightly off-center. On the other hand, since light is emitted from the non-resonating region 102 without resonance, the entire sub-pixel's extraction efficiency is increased, while its viewing angle characteristics are also improved or better when compared to light emitted from sub-pixels including only the resonating region 101. Thus, the extraction efficiency is increased when compared sub-pixels including the non-resonating region 102 only, and the viewing angle characteristics are relatively maintained or improved when compared to sub-pixels including the resonating region 101 only.

Figure 3A:
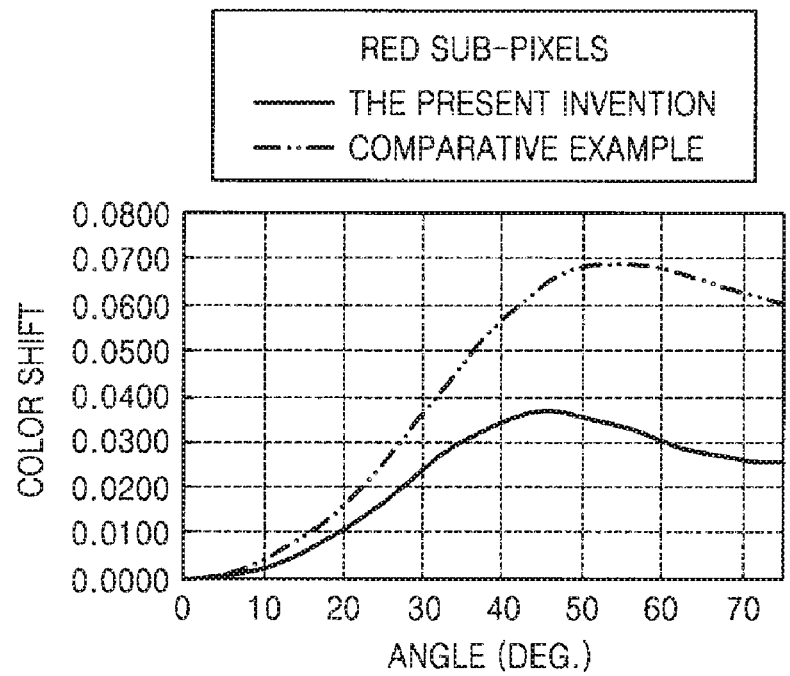
FIGS. 3A through 3C are graphs comparing color shift of the organic light-emitting display device including the sub-pixel of FIG. 1, with color shift of an organic light-emitting display device including a sub-pixel having only a resonating region for each respective R, G, or B sub-pixel.
Figure 3B:
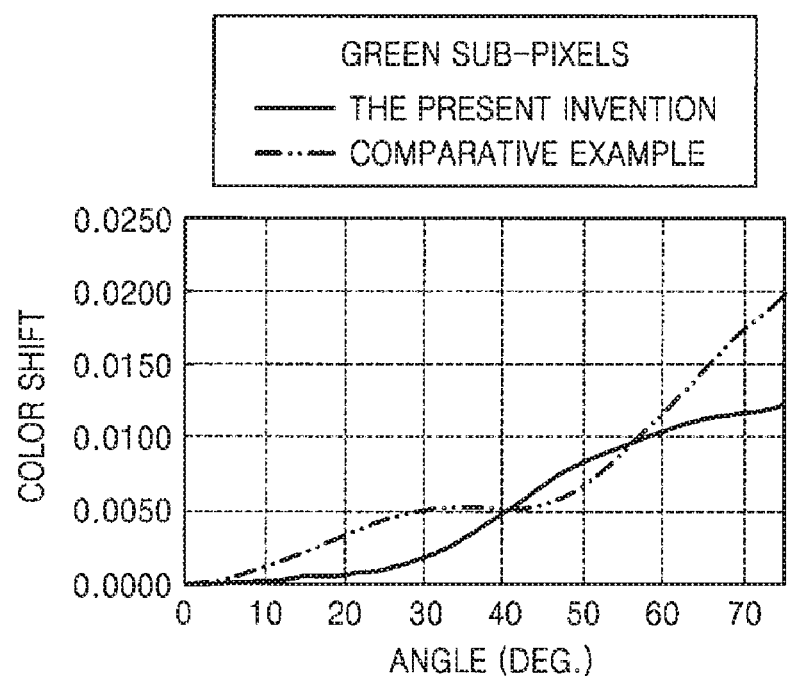
Figure 3C:
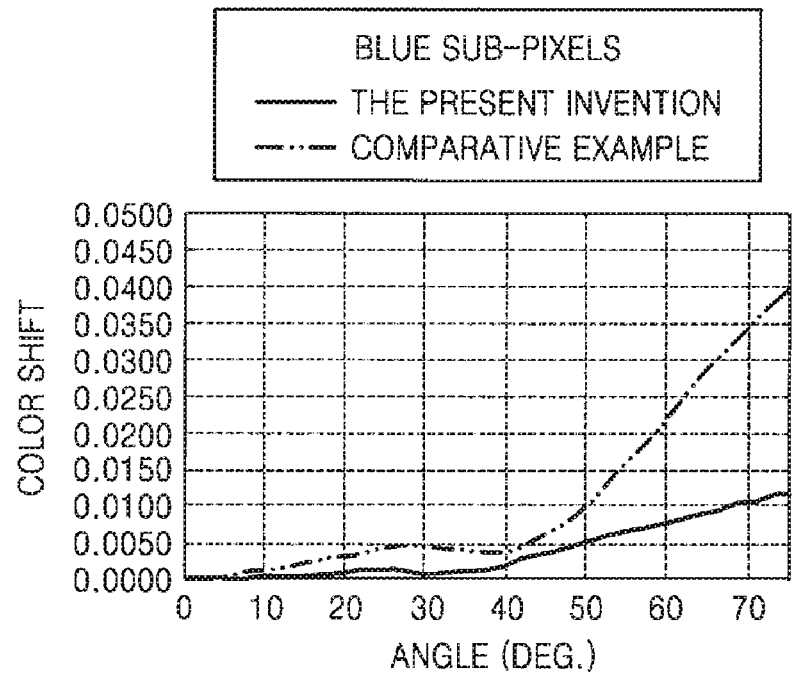
Figure 4A:
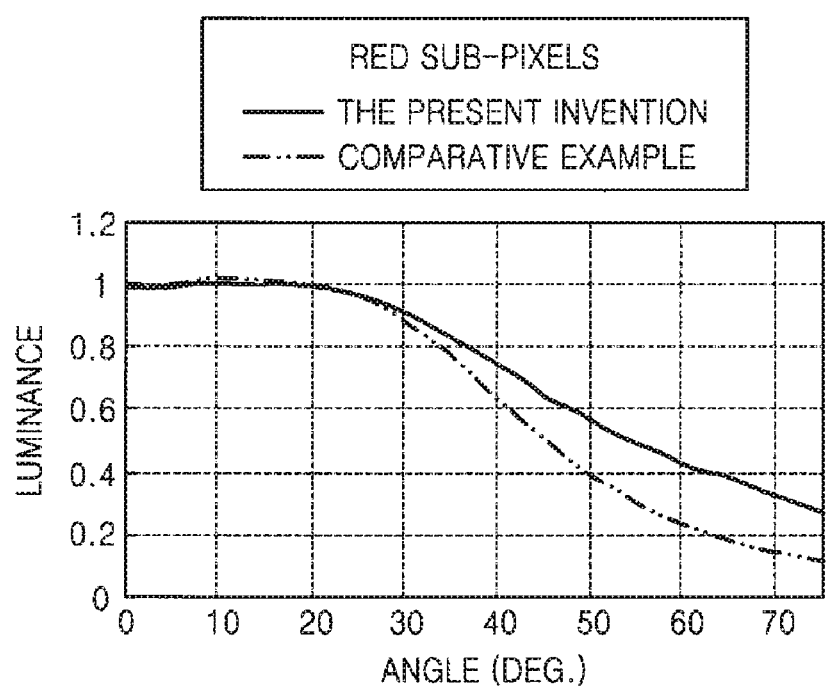
FIGS. 4A through 4C are graphs comparing luminance of the organic light-emitting display device including the sub-pixel of FIG. 1, with luminance of an organic light-emitting display device including a sub-pixel having only a resonating region for each respective R, G, or B sub-pixel.
Figure 4B:
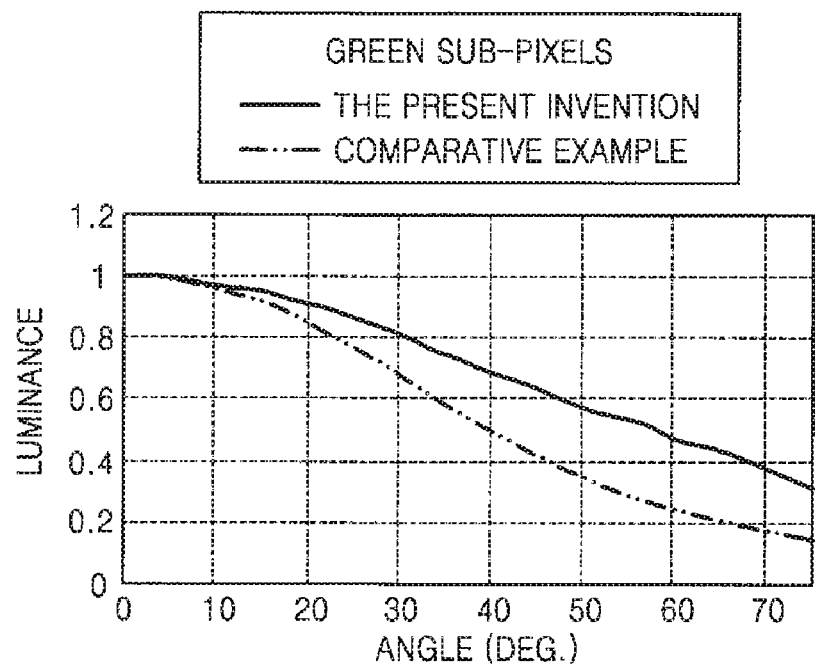
Figure 4C:
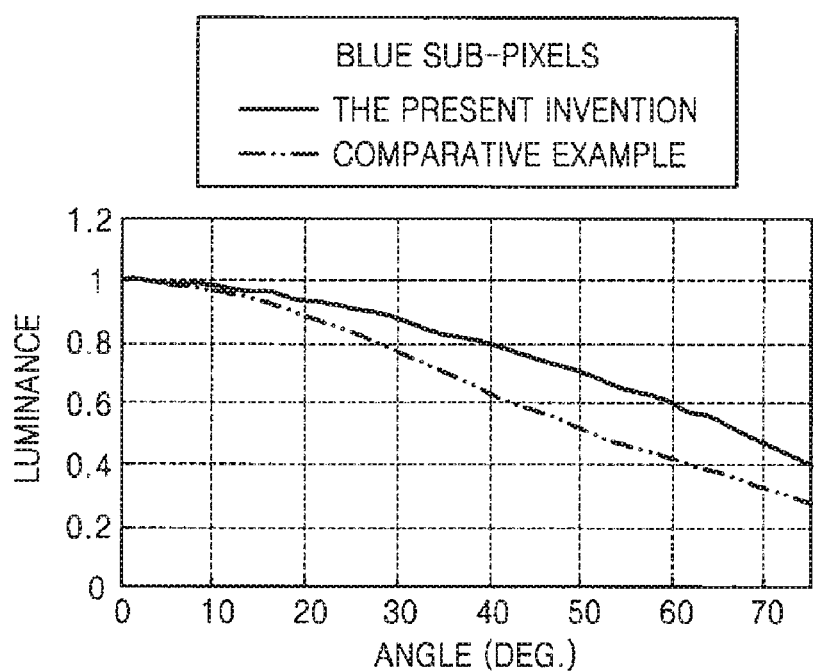

FIGS. 3A through 4C are graphs comparing viewing angle characteristics of an organic light-emitting display device including the sub-pixel of FIG. 1, with viewing angle characteristics of an organic light-emitting display device including sub-pixels having the resonating region 101 only, as a comparative example. FIGS. 3A through 3C are graphs comparing color shift of the organic light-emitting display device including the sub-pixel of FIG. 1, with color shift of an organic light-emitting display device including sub-pixels having the resonating region 101 only for each respective R, G, or B sub-pixel. FIGS. 4A through 4C are graphs comparing luminance of the organic light-emitting display device including the sub-pixel of FIG. 1, with luminance of an organic light-emitting display device including sub-pixels having the resonating region 101 only, for each respective R, G, or B sub-pixel.

As shown in FIGS. 3A through 3C, color coordination of the organic light-emitting display device of FIG. 1 is generally changed less according to various viewing angles than in the organic light-emitting display device including sub-pixels having the resonating region 101 only.

As shown in FIGS. 4A through 4C, luminance of the organic light-emitting display device of FIG. 1 is generally reduced less according to various viewing angles than in the organic light-emitting display device including sub-pixels having the resonating region 101 only.

Thus, the organic light-emitting display device including the sub-pixel of FIG. 1 may have improved extraction efficiency and viewing angle characteristics.

Figure 5:
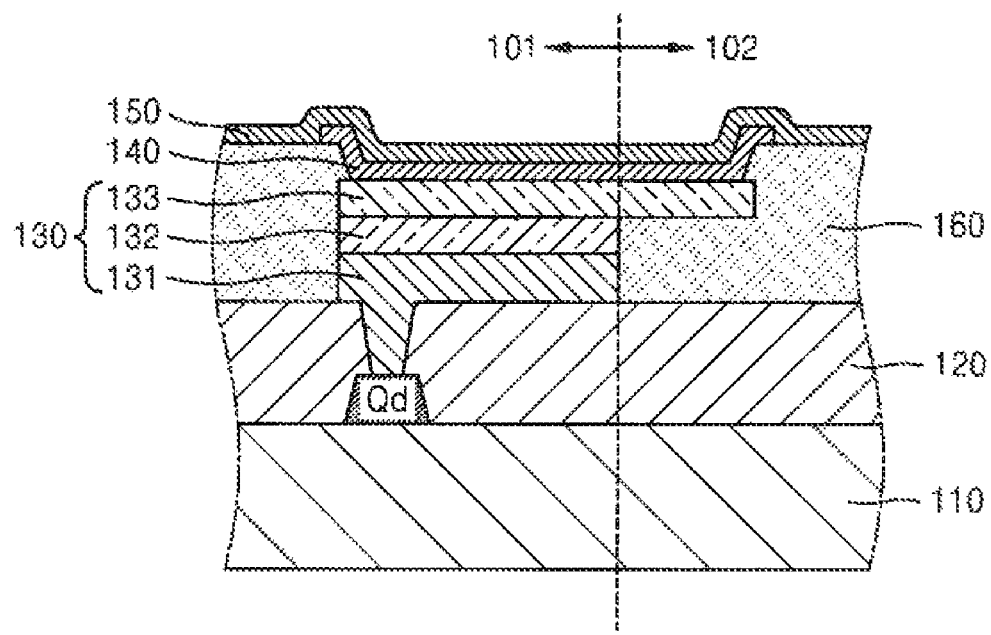
FIGS. 5 and 6 are cross-sectional views of sub-pixels of organic light-emitting display devices according to further embodiments of the present invention.

In FIG. 1, sizes of the resonating region 101 and the non-resonating region 102 of the sub-pixels are substantially the same. In some embodiments, to further exhibit a desired effect from among the above-described effects, the resonating region 101 and the non-resonating region 102 may be formed to be different sizes from one another as shown in FIG. 5. That is, to further increase the extraction efficiency, the resonating region 101 may be formed to be larger than the non-resonating region 102, like in FIG. 5. Even when the resonating region 101 is larger than the non-resonating region 102, the viewing angle characteristics may still be improved or better when compared to a sub-pixel including the resonating region 101 only, due to the presence of the non-resonating region 102.

Figure 6:
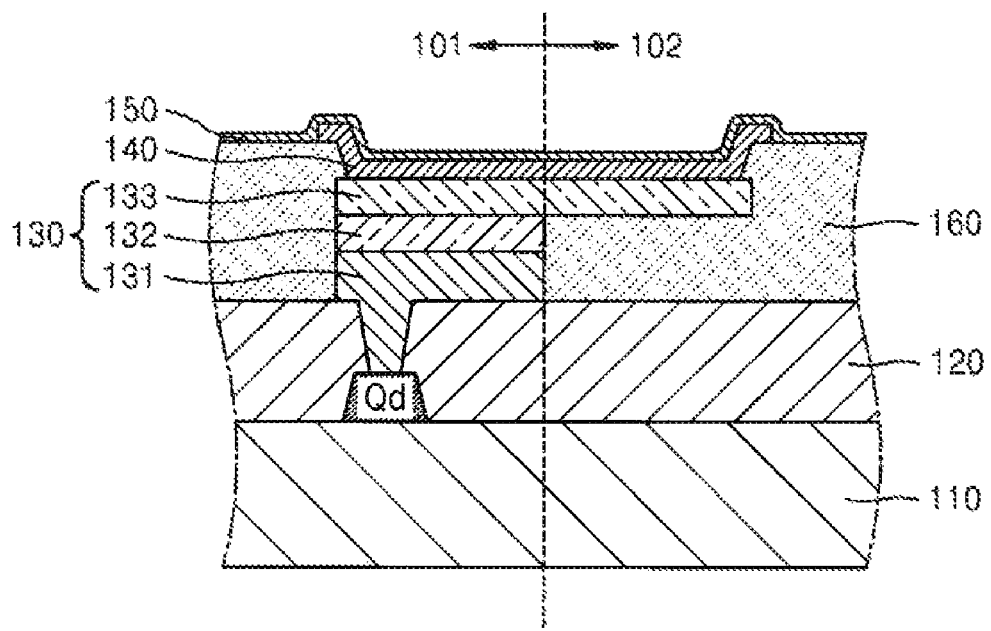

In addition, in FIG. 1, the organic light-emitting display device is a bottom emission type organic light-emitting display device, in which an image is realized (e.g., emitted) towards the first electrode 130. Alternatively, the organic light-emitting display device may be, for example, a double-sided emission type organic light-emitting display device, in which an image is realized towards the second electrode 150 as well as the first electrode 130. In this case, as shown in FIG. 6, the organic light-emitting display device may have semi-transmissive characteristics by thinning the second electrode 150. For example, if a thickness of the second electrode 150 is 1000 Å in FIG. 1, the thickness of the second electrode 150 may only be about 500 Å in FIG. 6. In other words, embodiments of the present invention are not limited by the emission type of the particular organic light-emitting display device.

The first and second transparent layers 133 and 131 of the first electrode 130 may be formed of, for example, indium tin oxide (ITO) or indium zinc oxide (IZO). The semi-transparent layer 132 may be formed of, for example, metal such as silver (Ag), aluminum (Al), magnesium (Mg), copper (Cu), MgAg, or CaAg, or a material for forming a Distributed Bragg Reflector, such as $SiO_2$, $SiNx$, ITO, $ZnO_2$, or $ZrO_2$.

As a result, an organic light-emitting display device having sub-pixels according to embodiments of the present invention may have improved extraction efficiency and viewing angle characteristics.

While the present invention has been particularly shown and described with reference to exemplary embodiments thereof, it will be understood by those of ordinary skill in the art that various changes in form and details may be made herein, without departing from the spirit and scope of the present invention, as defined by the following claims and equivalents thereof.

What is claimed is:

1. An organic light-emitting display device comprising a sub-pixel comprising:
   a first electrode and a second electrode facing one another; and
   an emission layer between the first electrode and the second electrode,
   wherein the sub-pixel has a resonating region in which light generated by the emission layer resonates and is emitted, and a non-resonating region in which light generated by the emission layer does not resonate and is emitted; and
   wherein the first electrode comprises:
      a first transparent layer in the non-resonating region and the resonating region;
      a semi-transparent layer in the resonating region and having a size different than a size of the first transparent layer; and
      a second transparent layer in the resonating region on a side of the semi-transparent layer opposite the first transparent layer, wherein a size of the second transparent layer corresponds to the size of the semi-transparent layer.

2. The organic light-emitting display device of claim 1, wherein an image is emitted towards the first electrode of the sub-pixel, and wherein the first electrode does not include a semi-transparent layer in the non-resonating region.

3. The organic light-emitting display device of claim 2, wherein an image is not emitted towards the second electrode, and wherein the second electrode comprises a reflective layer.

4. The organic light-emitting display device of claim 2, wherein an image is emitted towards the second electrode, and wherein the second electrode comprises a semi-transparent layer.

5. The organic light-emitting display device of claim 1, wherein the first transparent layer is shared by the non-resonating region and the resonating region.

6. The organic light-emitting display device of claim 1, wherein the first transparent layer comprises at least one of indium tin oxide (ITO) or indium zinc oxide (IZO).

7. The organic light-emitting display device of claim 1, wherein the semi-transparent layer comprises at least one of a metal material or a material for forming a Distributed Bragg Reflector.

8. The organic light-emitting display device of claim 7, wherein the semi-transparent layer comprises the metal material, and wherein the metal material comprises at least one of silver (Ag), aluminum (Al), magnesium (Mg), copper (Cu), MgAg, or CaAg.

9. The organic light-emitting display device of claim 7, wherein the semi-transparent layer comprises the material for forming the Distributed Bragg Reflector, and wherein the material for forming the Distributed Bragg Reflector comprises at least one of $SiO_2$, SiNx, ITO, $ZnO_2$, or $ZrO_2$.

10. The organic light-emitting display device of claim 1, wherein sizes of the resonating region and the non-resonating region of the sub-pixel are substantially the same.

11. The organic light-emitting display device of claim 1, wherein sizes of the resonating region and the non-resonating region of the sub-pixel are different from one another.

* * * * *

UNITED STATES PATENT AND TRADEMARK OFFICE
CERTIFICATE OF CORRECTION

| | |
|---|---|
| PATENT NO. | : 8,350,464 B1 |
| APPLICATION NO. | : 13/269445 |
| DATED | : January 8, 2013 |
| INVENTOR(S) | : Hee-Seong Jeong et al. |

Page 1 of 1

It is certified that error appears in the above-identified patent and that said Letters Patent is hereby corrected as shown below:

On the Title Page

(65) Prior Publication Data          Insert -- U.S.-2013-0002127-A1, January 3, 2013 --

(30) Foreign Application Priority Data          Insert -- (30) Foreign Application Priority Data

June 29, 2011
KR-10-2011-0064085 --

Signed and Sealed this
Fifth Day of May, 2015

Michelle K. Lee
*Director of the United States Patent and Trademark Office*